US010978569B2

(12) United States Patent
Nakano

(10) Patent No.: US 10,978,569 B2
(45) Date of Patent: Apr. 13, 2021

(54) PROCESS OF FORMING NITRIDE SEMICONDUCTOR DEVICE

(71) Applicant: SUMITOMO ELECTRIC DEVICE INNOVATIONS, INC., Kanagawa (JP)

(72) Inventor: Takuma Nakano, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 27 days.

(21) Appl. No.: 16/159,512

(22) Filed: Oct. 12, 2018

(65) Prior Publication Data

US 2019/0115449 A1 Apr. 18, 2019

(30) Foreign Application Priority Data

Oct. 16, 2017 (JP) .............................. JP2017-200369

(51) Int. Cl.
*H01L 21/02* (2006.01)
*H01L 29/66* (2006.01)
*H01L 29/778* (2006.01)
*H01L 29/45* (2006.01)
*H01L 21/3065* (2006.01)
(Continued)

(52) U.S. Cl.
CPC .... *H01L 29/66462* (2013.01); *H01L 21/0217* (2013.01); *H01L 21/0262* (2013.01); *H01L 21/0272* (2013.01); *H01L 21/0274* (2013.01); *H01L 21/02211* (2013.01); *H01L 21/02263* (2013.01); *H01L 21/28587* (2013.01); *H01L 21/3065* (2013.01); *H01L 21/3105* (2013.01); *H01L 29/458* (2013.01); *H01L 29/778* (2013.01); *H01L 29/7787* (2013.01); *H01L 29/2003* (2013.01); *H01L 29/41766* (2013.01)

(58) Field of Classification Search
CPC ........... H01L 29/2003; H01L 29/41766; H01L 29/452; H01L 29/66431; H01L 29/66462; H01L 29/66727; H01L 29/66734
See application file for complete search history.

(56) References Cited

U.S. PATENT DOCUMENTS 9,583,678 B2 * 2/2017 Cich ....................... F21V 29/70
2007/0278507 A1 * 12/2007 Nakazawa ........ H01L 29/66462
257/94
(Continued)

FOREIGN PATENT DOCUMENTS

JP 2001-077204 3/2001
JP 2013-123047 6/2013

*Primary Examiner* — Jaehwan Oh
(74) *Attorney, Agent, or Firm* — Smith, Gambrell & Russell, LLP.

(57) ABSTRACT

A process of forming a nitride semiconductor device is disclosed. The process first deposits a silicon nitride (SiN) film on a semiconductor layer by the lower pressure chemical vapor deposition (LPCVD) technique at a temperature, then, forming an opening in the SiN film for an ohmic electrode. Preparing a photoresist on the SiN film, where the photoresist provides an opening that fully covers the opening in the SiN film, the process exposes a peripheral area around the opening of the SiN film to chlorine (Cl) plasma that may etch the semiconductor layer to form a recess therein. Metals for the ohmic electrode are filled within the recess in the semiconductor layer and the peripheral area of the SiN film. Finally, the metals are alloyed at a temperature lower than the deposition temperature of the SiN film.

8 Claims, 5 Drawing Sheets

(51) Int. Cl.
*H01L 21/027* (2006.01)
*H01L 21/285* (2006.01)
*H01L 21/3105* (2006.01)
H01L 29/20 (2006.01)
H01L 29/417 (2006.01)

(56) References Cited

U.S. PATENT DOCUMENTS

| | | | | |
|---|---|---|---|---|
| 2009/0065938 | A1* | 3/2009 | Takano | H01L 33/40 |
| | | | | 257/750 |
| 2011/0140173 | A1* | 6/2011 | Ramdani | H01L 29/66462 |
| | | | | 257/194 |
| 2012/0138986 | A1* | 6/2012 | Chung | H01L 33/22 |
| | | | | 257/98 |
| 2013/0299846 | A1* | 11/2013 | Donkers | H01L 29/2003 |
| | | | | 257/76 |
| 2014/0167062 | A1* | 6/2014 | Oka | H01L 29/7813 |
| | | | | 257/76 |
| 2014/0370631 | A1* | 12/2014 | Thompson | H01L 33/005 |
| | | | | 438/34 |
| 2018/0240753 | A1* | 8/2018 | LaRoche | H01L 21/28264 |

\* cited by examiner

PROCESS OF FORMING NITRIDE SEMICONDUCTOR DEVICE

CROSS REFERENCE TO RELATED APPLICATION

The present application is based on and claims the benefit of priority of Japanese Patent Application No. 2017-200369, filed on Oct. 16, 2017, the entire content of which is incorporated herein by reference.

BACKGROUND OF INVENTION

1. Field of Invention

The present invention relates to a process of forming a semiconductor device, in particular, a semiconductor device primarily made of nitride semiconductor materials.

2. Background Arts

A Japanese Patent Application laid open No. JP2013-123047A has disclosed a process of forming a nitride semiconductor device. The process disclosed therein first covers nitride semiconductor layers with an insulating film formed by the low pressure chemical vapor deposition (LPCVD) technique, where the passivation film contains silicon nitride (SiN); then, forms a recess in the semiconductor layers by etching the passivation film to partially expose a surface of the semiconductor layers. Selectively growing a p-type gallium nitride (GaN) layer within the recess, and forming a gate electrode onto the p-type GaN, an electron device primarily made of nitride semiconductor materials may be formed. The prior patent document above mentioned has disclosed, or suggested, that the passivation film is deposited at a temperature higher than 550° C., preferably higher than 700° C.

Another prior Japanese Patent Application laid open No. JP2001-077204A has disclosed a hetero-bipolar transistor and a process of forming the same. The process disclosed therein, before depositing an SiN film on a substrate, the substrate is pre-processed by electron-cyclotron resonance reactive ion etching (ECR-RIE) using a mixed gas of chlorine ($Cl_2$) and argon (Ar) to enhance adhesion between the substrate and the SiN film.

SUMMARY OF INVENTION

An aspect according to embodiment of the present invention relates to a process of forming a nitride semiconductor device. The process includes steps of: (a) epitaxially growing semiconductor layers made of nitride semiconductor materials on a substrate where the semiconductor layers forms a semiconductor stack; (b) depositing a silicon nitride (SiN) film on the semiconductor stack by a low pressure chemical vapor deposition (LPCVD) technique; (c) forming an opening in the SiN film; (d) exposing a surface of the semiconductor tack appearing within the opening in the SiN film and a peripheral area of a surface of the SiN film around the opening to plasma that contains chlorine (Cl) ions and partially etches the semiconductor stack to form a recess therein; and (e) depositing metals on the surface of the semiconductor stack exposed within the opening in the SiN film and the peripheral area of the surface of the SiN film; and (f) alloying the metals to form electrodes for a non-rectified contact against the semiconductor stack at an alloying temperature lower than the deposition temperature.

BRIEF DESCRIPTION OF DRAWINGS

The foregoing and other purposes, aspects and advantages will be better understood from the following detailed description of a preferred embodiment of the invention with reference to the drawings, in which.

DESCRIPTION OF EMBODIMENT

Next, embodiment according to the present invention will be described as referring to drawings. However, the present invention is not restricted to the embodiment, and has a scope indicated by claims attached and all modification and/or changes within the claims and equivalents thereto. Also, in the description of the drawings, numerals or symbols same with or similar to each other will refer to elements same with or similar to each other without duplicating explanations.

Figure 1:
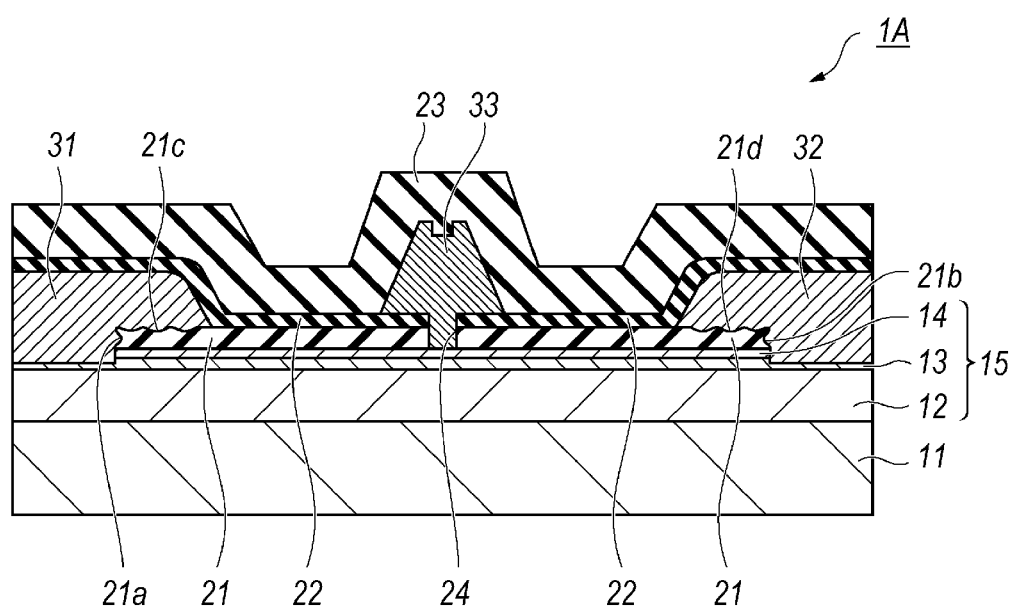
FIG. 1 is a cross sectional view of a semiconductor device according to embodiment of the present invention.

FIG. 1 is a cross sectional view of an semiconductor device 1A formed by a process according to embodiment of the present invention. The semiconductor device 1A is a type of field effect transistor (FET), in particular, a type of high electron mobility transistor (HEMT) primarily made of nitride semiconductor materials. The HEMT 1A of the embodiment includes a substrate 11, nitride semiconductor layers, 12 to 14, first to third silicon nitride (SiN) films, 21 to 23, and electrodes of a source 31, a drain 32, and a gate 33.

The substrate 11 is made of silicon carbide (SiC) with a primary surface with (0001) crystal plane. However, the substrate 11 is not restricted to SiC with (0001) crystal plane, and may be made of other materials, for instance, silicon (Si), gallium nitride (GaN), sapphire ($Al_2O_3$) and so on, as far as the substrate 11 enabling semiconductor epitaxial growth thereon. The semiconductor stack 15 may include, from a side of the substrate 11, a channel layer 12, a barrier layer 13, and a cap layer 14, each sequentially grown on the substrate 11. The channel layer 12 may be made of undoped GaN with a thickness around 1 specifically, 0.5 to 1.5 The barrier layer 13 may be made of n-type aluminum gallium nitride (AlGaN), or n-type indium aluminum nitride (InAlN), with a thickness of 20 nm, specifically, 10 to 30 nm. The cap layer 14 may be made of n-type GaN with a thickness of 5 nm, specifically, 3 to 8 nm. The semiconductor device 1A thus configured may form a two-dimensional electron gas (2DEG) in the channel layer 12 at the interface against the barrier layer 13, where the 2DEG becomes a channel for the semiconductor device 1A.

The first SiN film 21, which has a function of passivating a surface of the semiconductor stack 15, covers a whole surface of the semiconductor stack 15. The first SiN film 21 provides source and drain openings, 21a and 21b, within which the semiconductor stack 15 exposes. Specifically, the whole cap layer 14 and a portion of the barrier layer 13 are removed within the openings, 21a and 21b, to expose the barrier layer 13 therein. The source electrode 31 not only fills the source opening 21a but extends to a peripheral area 21c on the first SiN film 21 around the source opening 21a. The drain electrode 32 has a structure similar to the source electrode 31. That is, the drain electrode 32 fills the drain opening 21b to be in direct contact with the barrier layer 13 exposed within the drain opening 21b and extends in a peripheral area 21d on the first SiN film 21 around the drain opening 21b. Thus, the source electrode 31 and the drain electrode 32 have a cross section of a T-character.

The peripheral areas, 21c and 21d, on the first SiN film 21 around the respective openings, 21a and 21b, show a roughed surface of the first SiN film 21 compared with a rest portion on the first SiN film 21 because, as described later in the present specification, those peripheral areas, 21c and 21d, are exposed for plasma during a step of forming the recesses in the semiconductor stack 15.

The second SiN film 22 covers the first SiN film 21 and the electrodes of the source 31 and the drain 32. The first and second SiN films, 21 and 22, provide a gate opening 24 between the source opening 21a and the drain opening 21b. The gate opening 24 pierces the first and second SiN films, 21 and 22, to expose a surface of the cap layer 14. That is, the cap layer 14 and the barrier layer 13 are not partly removed within the gate opening 24 different from the openings, 21a and 21b, for the source and drain electrodes, 31 and 32. The gate electrode 33 fills the gate opening 24 to be in direct contact with the cap layer 14 and extends on the second SiN film 22 around the gate opening 24. Thus, the gate electrode 33 also has a cross section of a T-character.

The first SiN film 21 has a thickness of 10 to 100 nm, preferably 20 nm in the present embodiment. The first SiN film 21 with a thickness of at least 10 nm may secure a gap between the semiconductor stack 15 and an expanded portion of the T-shaped gate electrode 33, which may suppress parasitic capacitance induced therebetween. Also, the first SiN film 21 with a thickness of 100 nm at most may leave a function effective to moderate electric field strength at an edge of the gate electrode 33 by the existence of the overhang of the T-shaped gate electrode 33, which may reduce a gate leak current. On the other hand, the second SiN film 22 preferably has a thickness of 40 nm; but the second SiN film 22 may be omitted depending on application and performance of the semiconductor device 1A.

The electrodes of the source 31 and the drain 32 are a type of, what is called, an ohmic electrode showing a non-rectified characteristic against the barrier layer 13. The source electrode 31 and the drain electrode 32, which have a thickness around 300 nm, may be formed by alloying stacked metals of one of tantalum/aluminum/tantalum, which may denoted as Ta/Al/At, titanium/aluminum/titanium, which may be denoted as Ti/Al/Ti, and titanium/aluminum/nickel/gold, which may be denoted as Ti/Al/Ni/Au. The gate electrode 33, which is a type of Schottky electrode, may be stacked metals of nickel (Ni) and gold (Au), where Ni operates as the Schottky contact against the cap layer 14. The third SiN film 23 fully covers the gate electrode 33 and the second SiN film 22 exposed from the gate electrode 33.

Next, a process of forming the semiconductor device 1A will be described referring to FIG. 2A to FIG. 4C where those drawings are cross sectional views of the semiconductor device 1A at respective steps of the process.

Figure 2A:
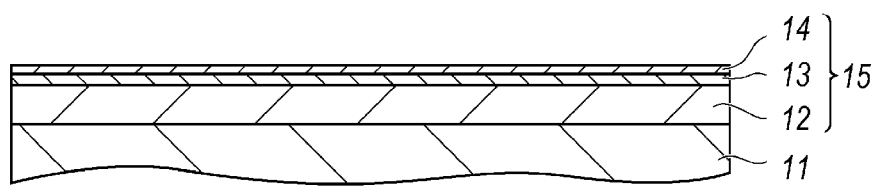
FIG. 2A to FIG. 2C are cross sectional views of the semiconductor device shown in FIG. 1 at respective steps of the process thereof.

First, as shown in FIG. 2A, the process epitaxially grows semiconductor layers, 12 to 14, on the substrate 11 to form the semiconductor tack 15. That is, the process epitaxially grows the channel layer 12 on the substrate 11, the barrier layer 13 on the channel layer 12, and the cap layer 14 on the barrier layer 13 sequentially and continuously by the MOCVD technique. The epitaxial growth uses source materials of tri-methyl-gallium (TMG) and ammonia ($NH_3$) for a GaN layer, those of tri-methyl-aluminum (TMA), TMG, and $NH_3$ for an AlGaN layer, and those of tri-methyl-indium (TMI), TMG, and $NH_3$ for an InAlN layer when the barrier layer 13 is made of InAlN. Also, mono-silane ($SiH_4$) is used as a source material for an n-type dopant in growing the barrier layer 13 and the cap layer 14.

Figure 2B:
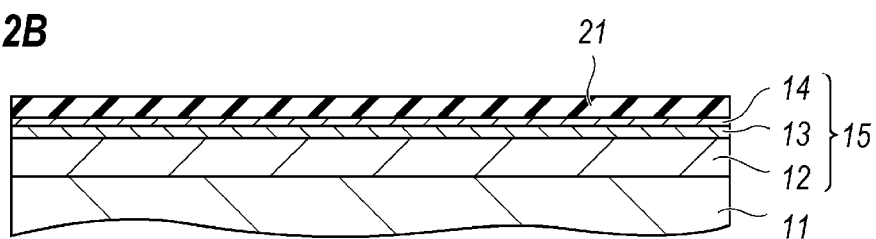

Thereafter, the first SiN film 21 is deposited on the semiconductor stack 15 by the LPCVD technique as shown in FIG. 2B. Exemplary Conditions of the LPCVD technique are a growth temperature of 700 to 800° C., a growth pressure of 10 to 60 Pa, and source materials of di-chlorosilane ($SiH_2Cl_2$) for silicon (Si) and $NH_3$ for nitrogen (N). As described, the first SiN film 21 may be deposited by a thickness of 10 to 100 nm.

Figure 2C:
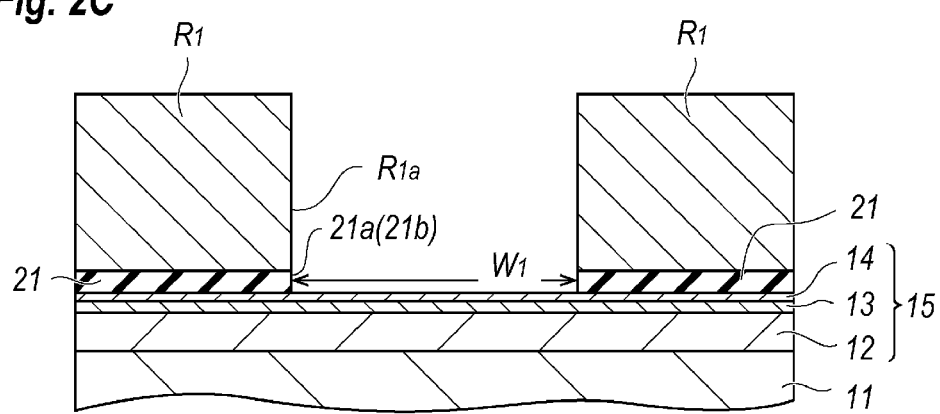

Thereafter, the source opening 21a and the drain openings 21b are formed in the first SiN film 21. Specifically, as shown in FIG. 2C, a patterned photoresist R1 is first prepared on the first SiN film 21, where the patterned photoresist R1 has an opening R1a corresponding to the openings, 21a and 21b, where FIG. 2C representatively illustrates only one opening R1a for the source opening 21a. Etching the first SiN film 21 exposed within the opening R1a by the reactive ion etching (RIE) using a reactive gas containing fluorine (F), the process may from the source opening 21a and the drain opening 21b each having a width $W_1$. The openings of the source 21a and the drain 21b may have widths substantially same with each other; but have respective widths different from each other.

Figure 3A:
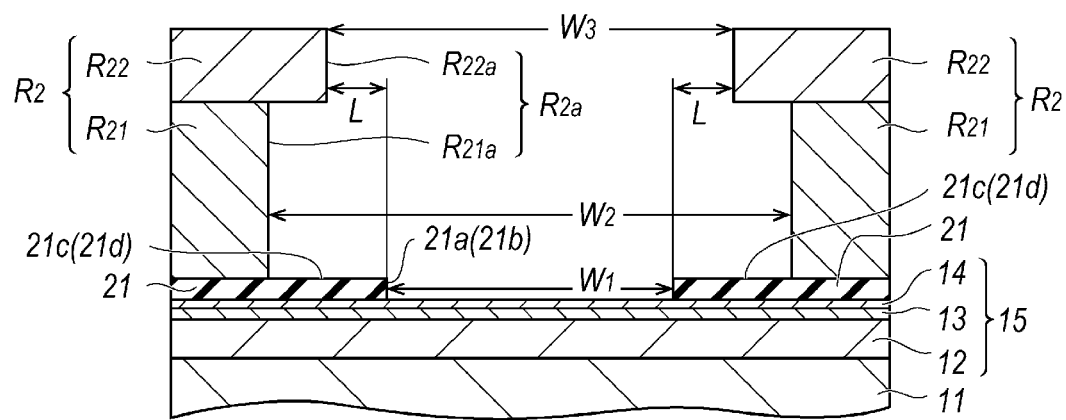
FIG. 3A and FIG. 3B are cross sectional views of the semiconductor device shown in FIG. 1 at steps subsequent to the step shown in FIG. 2C.

Thereafter, removing the patterned photoresist R1, the process prepares another patterned photoresist R2 on the first SiN film 21, where another patterned photoresist R2 provides an opening R2a corresponding to the source electrode 31 and the drain electrode 32, where FIG. 3A illustrates only one of the openings R2a for the source electrode 31. The opening R2a has two portions, R21 and R22, vertically distinguishable from each other, where the upper portion R22 forms an overhang with respect to the lower portion R21. A photolithography technique to prepare the patterned photoresist R2 is as follows: (a) first coating the first SiN film 21 sequentially with the lower photoresist R21 and the upper photoresist R22, where the lower photoresist R21 has optical sensitivity different from that of the upper photoresist R22; specifically, the lower photoresist has greater sensitivity than compared with that of the upper photoresist R21; (b) illuminating the upper and lower photoresists, R22 and R21, concurrently; and (c) developing the photoresists, R21 and R22, the patterned photoresist R2 with a cross section shown in FIG. 3A may be obtained. Because of the difference in the photo-sensitivity between the upper and the lower photoresists, R22 and R21, the upper photoresist R22 forms the opening R22a with a width W3 that is smaller than a width W2 of the opening R21a in the lower photoresist R21. Also, the width W3 of the opening R22a in the upper photoresist R22 is greater than the width W1 of the opening 21a formed in the first SiN film 21. Thus, the edge of the upper photoresist R22 is retreated from the edge of the opening 21a in the first SiN film by a distance L, which is equal to a half of a difference between the width W1 of the opening 21a and that $W_3$ of the upper photoresist R22. Thus, the photoresist R2 forms the opening R2a corresponding to the source electrode 31 and the drain electrode 32.

A feature of the photolithography of the present step is that the opening R2a in the photoresist R2 is wider than the source opening 21a or the drain opening 21b. That is, the width W3 in the opening R22a of the upper photoresist R22 is greater than the width W1 of the source opening 21a and the drain opening 21b. Also, the width W2 of the opening R21a in the lower photoresist R21 is greater than the width W3 of the opening R22a in the upper photoresist R22. Specifically, the edge of the opening R22a in the upper photoresist R22 retreats around 0.5 μm, preferably 0.4 to 0.7 μm, from the edge of the source opening 21a and that of the drain opening 21b, which is indicated by the distance L in FIG. 3A. Thus, the peripheral areas, 21c and 21d, around the source opening 21a and the drain opening 21b in a width around 0.5 μm may be exposed from the photoresist R2 or become visible through the photoresist R2.

Figure 3B:
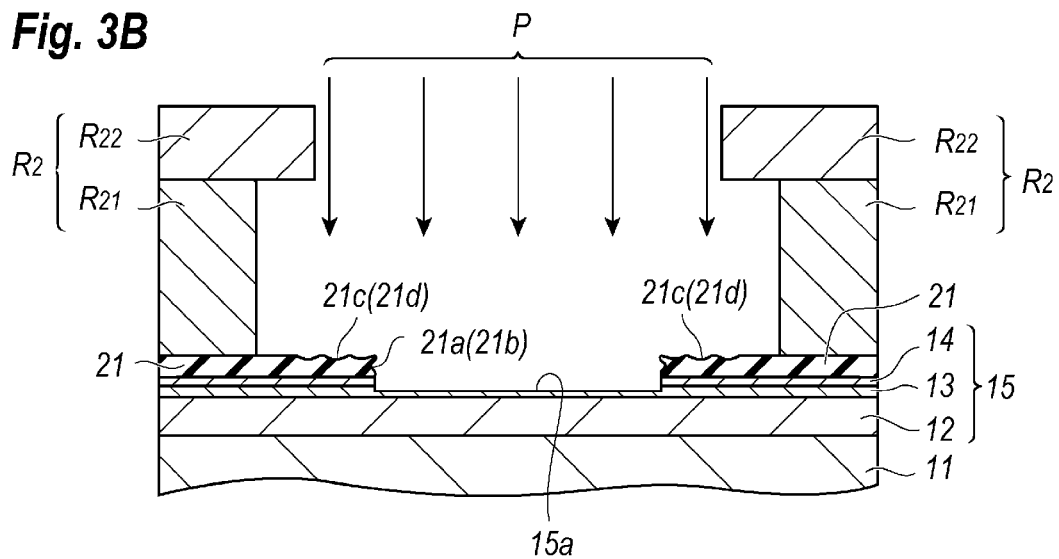

Thereafter, as shown in FIG. 3B, the peripheral areas, 21c and 21d, appearing within the opening R2a of the photoresist R2 are exposed in plasma P containing chlorine (Cl); typically that induced by chlorine ($CL_2$) or silicon tetrachloride ($SiCl_4$). Because such plasma containing chlorine (Cl) may etch nitride semiconductor materials, semiconductor layers 15 exposed in the source opening 21a and the drain opening 21b are partially etched. That is, the cap layer 14 and a part of the barrier layer 13 exposed in the openings, 21a and 21b, in the first SiN film 21 are etched by a depth to partly leave the barrier layer 13, by a thickness of, for instance, 10 nm at most. Thus, the plasma process using a gas containing chlorine (Cl) forms recesses 15a in the surface of the semiconductor stack 15. The source electrode 31 and the drain electrode 32 may be formed within the recesses 15a and in direct contact with the barrier layer 13, which may reduce contact resistance of the source electrode 31 and the drain electrode 32.

The plasma process for partially etching the semiconductor stack 15 may also affect the peripheral areas, 21c and 21d, on the first SiN film 21 appearing within the opening R2a of the photoresist R2. Specifically, the peripheral areas, 21C and 21d, exposed to the chlorine (Cl) plasma in surfaces thereof are roughened compared with other portions of the surface of the first SiN film 21 hidden by the photoresist R2. The chlorine plasma is hard to etch an SiN film compared with nitride semiconductor materials containing gallium (Ga), aluminum (Al), indium (In) and so on. Accordingly, the plasma process above described using a gas containing chlorine (Cl) hardly etches the first SiN film 21, practically by a depth almost 0.3 nm at most, but only roughens the surface thereof.

Figure 4A:
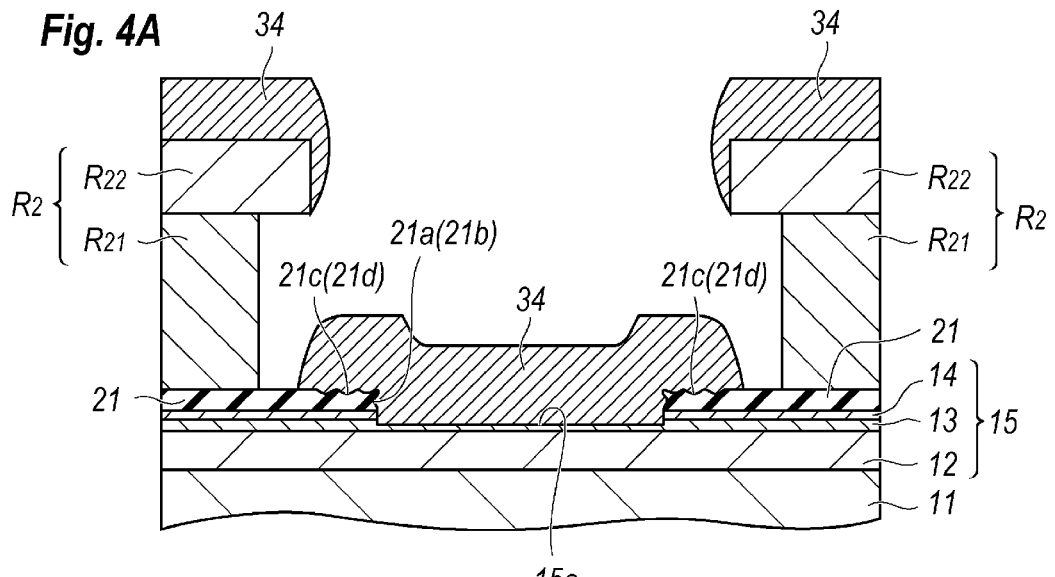
FIG. 4A to FIG. 4C show cross sectional views of the semiconductor device shown in FIG. 1 at respective steps subsequent to the step shown in FIG. 3B.

Thereafter, as shown in FIG. 4A, the process forms the source electrode 31 in contact with the barrier layer 13 through the source opening 21a and the drain electrode 32 also in contact with the barrier layer 13 through the drain opening 21b. Specifically, depositing metals 34 for the electrodes, 31 and 32, sequentially within the opening 21a in the first SiN film 21, the peripheral areas, 21c and 21d, on the first SiN film 21, and on the photoresist R2, where the metals 34 includes at least one of Ta, Ti, and Ni, as the first metal and Al as the second metal. The metals 34 not only fills the recess 15a in the semiconductor stack 15, and covers the peripheral areas, 21c and 21d, around the opening 21a, but accumulate onto the photoresist R2.

Figure 4B:
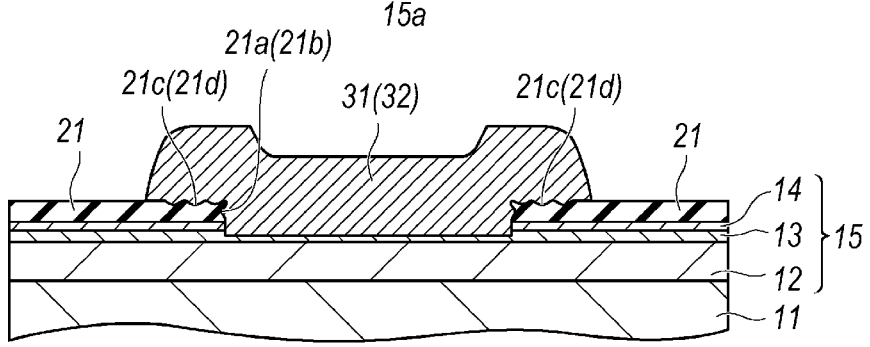

Removing the photoresist R2 by solvent, the residual metals 34 accumulated on the photoresist R2 may be also removed, which is sometimes called as the lift-off process, as leaving the metal 34 for the electrodes of the source 31 and the drain 32, as shown in FIG. 4B. Alloying the stacked metals 34 at a temperature 500 to 600° C., which is lower than a deposition temperature of the first SiN film 21, the electrodes of the source 31 and the drain 32, may be formed as the non-rectified contact.

Figure 4C:
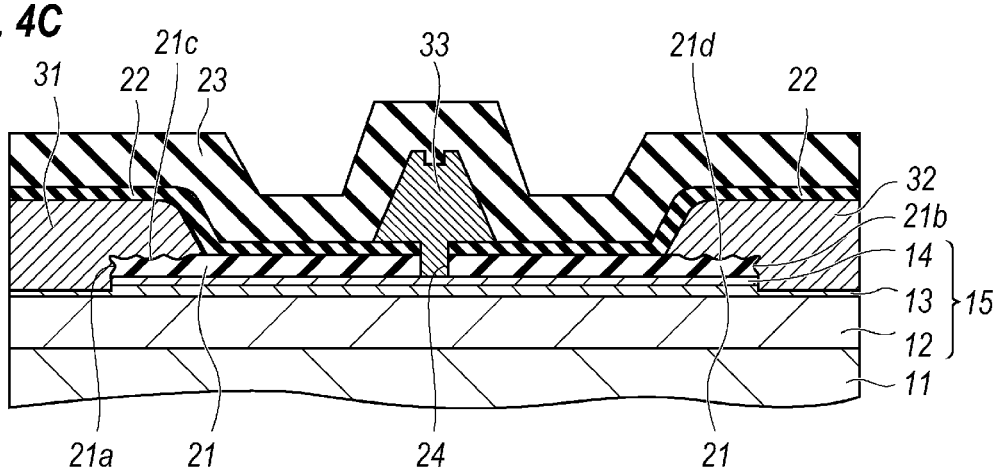

Thereafter, as shown in FIG. 4C, the process deposits another SiN film 22 as the second insulating film so as to cover the electrodes of the source 31 and the drain 32, and the first SiN film 21 exposed between the electrodes, 31 and 32. The second SiN film 32 may be deposited by, for instance, the plasma assisted chemical vapor deposition (p-CVD) technique difference from that for the first SiN film 21 because the second SiN film 22 is necessary to be processed after the thermal process for the electrodes of the source 31 and the drain 32. The p-CVD technique generally carries the deposition at a temperature far lower than that a deposition temperature of the LPCVD technique, where the present embodiment deposits the second SiN film 22 at a temperature around 300° C. After the deposition of the second SiN film 22, the process forms the gate electrode 33. Specifically, forming a gate opening 24 in the first and second SiN films, 21 and 22, then depositing a gate metal so as to fill the gate opening 24 and partially cover the second SiN film 22 in peripheries of the gate opening 24, the gate electrode 33 with a T-shaped cross section as shown in FIG. 4C may be formed. Finally, still another SiN film 23, which is the third SiN film 23 covers the gate electrode 33 and the second SiN film 22 exposed from the gate electrode 33. The third SiN film 23 may be also formed by the p-CVD technique. Thus, the process of forming the nitride semiconductor device 1A according to the present embodiment may be completed.

Figure 5:
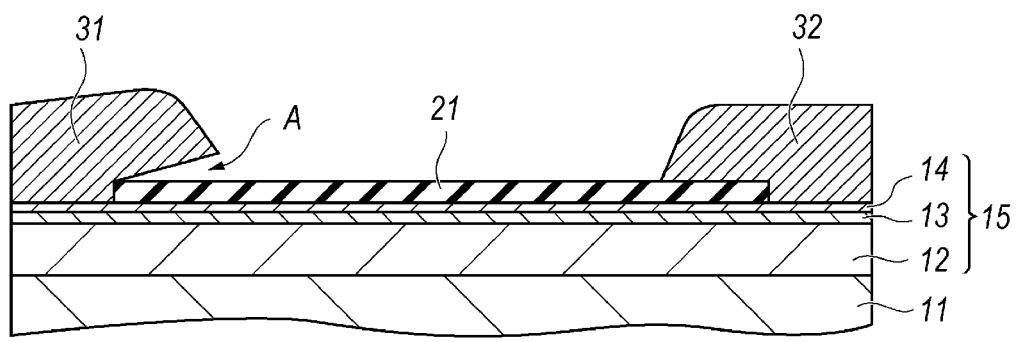
FIG. 5 is a cross sectional view explaining a subject left in conventional processes and structures of a semiconductor device.

Advantages according to the present invention will be described. When metals for the source electrode 31 and/or the drain electrode 32 are alloyed to form a non-rectified contact as the metals 34 are in contact with the first SiN film 21; atoms contained in the metals 34 may react with silicon (Si) contained in the SiN film 21 to cause silicide materials. In the present embodiment, aluminum (Al) in the metals 34 may easily cause an aluminum silicide (AlSix). In order to prevent the formation of AlSix, the first SiN film 21 may be preferable to be deposited by the LPCVD technique at a temperature higher than 700° C. that is higher than a alloying temperature, where the LPCVD technique may form a dense SiN film by raising a deposition temperature thereof concurrently with a lowered deposition pressure. The first SiN film 21 deposited by the LPCVD technique according to the present embodiment becomes excessively dense to suppress or substantially prevent the formation of aluminum silicide (AlSix) even when the metals 34 of the non-rectified contact are alloyed at a temperature higher than 500° C. However, a dense SiN film generally degrades the adhesion of the metals deposited thereon. Accordingly, the metals deposited on the SiN film in a peripheral portion A are easily peeled off from the SiN film as shown in FIG. 5.

The process according to the present embodiment, in order to solve a subject above described, first prepares the patterned photoresist R2 with the opening R2a whose width W3 is greater than the width W1 of the openings, 21a and 21b, in the first SiN film 21, which means the peripheral areas, 21c and 21d, around the openings, 21a and 21b, become visible through the photoresist R2. Accordingly, the peripheral areas, 21c and 21d, of the first SiN film 21 is exposed for the plasma formed by a gas containing chlorine (Cl) during the formation of the recess 15a in the semiconductor stack 15 by the plasma, which may roughen the surface of the peripheral areas, 21c and 21d, of the first SiN film 21 to cause an anchor effect for the metals deposited thereon. That is, the metals for the source electrode 31 and the drain electrode 32 may be securely and tightly in contact with the peripheral areas, 21c and 21d, of the SiN film 21, respectively. Accordingly, even the process of alloying the metals 34 at a high temperature, the electrodes of the source, 31 and the drain 32, are not peeled off from the SiN film 21.

The process according to the present embodiment uses the plasma containing fluorine (F) for forming the source opening 21a and the drain opening 21b in the first SiN film 21. However, the first SiN film 21 is covered with the patterned photoresist R1 during the formation of the openings, 21a and 21b, except for areas to be etched. Accordingly, the first SiN film 21 in the surface thereof is not exposed to the plasma during the formation of the openings, 21a and 21b.

Also, the peripheral areas, 21c and 21d, exposed to the plasma may have a width around 0.5 μm from the respective edge of the openings, 21a and 21b. The process according to the present embodiment forms the patterned photoresist R2 with the opening R2a thereof that fully covers the openings, 21a and 21b, in the first SiN film 21 and has the width W3 thereof greater than the width W1 of the openings, 21a and 21b, by at least (W3−W1)/2, which may retreat the edge of the opening R2a in the patterned photoresist R2 by around 0.5 μm from the edge of the openings, 21a and 21b.

The metals 34 to be converted into the electrodes of the source 31 and the drain 32 may include one of Ta layer, Ti layer and Ni layer as the first layer, and Al layer as the second layer. The metals 34 thus configured may be alloyed at a temperature 500 to 600° C. that is lower than a deposition temperature of the first SiN film 21. During the alloy of the metals 34, the interfaces between the metals 34 and the first SiN film 21 in the peripheries, 21C and 21d, are also raised in a temperature above 500° C. However, because the first SiN film 21 of the present embodiment is deposited by the LPCVD technique at a temperature higher than 700° C., which is also higher than the temperature of alloying the metals 34 for the electrodes of the source 31 and the drain 32. Accordingly, the interface in the peripheral areas, 21c and 21d, may be stable even at the alloying temperature, which suppresses or substantially prevents the inter-diffusion between aluminum (Al) and silicon (Si) to cause AlSix.

Also, during the formation of the recess 15a in the semiconductor stack 15, the process of the embodiment fully etches the cap layer 14 to leave a portion of the barrier layer 13. Filling the recess 15a with the metals 34 for the electrodes, 31 and 32, the metals 34 may be in direct contact with the barrier layer 13 and reduce the contact resistance thereof.

The process of forming the recess 15a may use the plasma P generated from the reactive gas of $Cl_2$ or $SiCl_4$, which may secure the etching ratio for the first SiN film 21 against the semiconductor stack 15 in small enough, which may form the recess 15a but merely roughening the surface of the first SiN film 21 in the peripheral areas, 21c and 21d, thereof. Also, the first SiN film 21 may be formed by the LPCVD technique at a temperature of 700 to 800° C. under a pressure of 10 to 60 Pa using source gases of di-chloro-silane ($SiH_2Cl_2$) for silicon (Si) and ammonia ($NH_3$) for nitrogen (N). Thus, the process according to the present embodiment may form the first SiN film 21 enough dense and stable, which may prevent aluminum (Al) contained in the metals 34 for the electrodes of the source 31 and the drain 32 from reacting with silicon (Si) in the first SiN film 21 to form aluminum silicide (AlSix) therebetween.

While particular embodiment of the present invention has been described herein for purposes of illustration, many modifications and changes will become apparent to those skilled in the art. For instance, although the embodiment concentrates on an electron device type of high electron mobility transistor (HEMT), the process of the present embodiment may be applicable to other types of electron devices having an SiN film and electrodes formed by alloying metals at a high temperature. Also, the process of the embodiment provides only one photolithography for depositing the metals for the electrodes. That is, a process for forming a recess in a semiconductor stack and for exposing a surface of an SiN film for plasma are concurrently carried out using a common photoresist. However, those processes may be independently carried out using respective patterned photoresist. Accordingly, the appended claims are intended to encompass an such modifications and changes as fall within the true spirit and scope of this invention.

What is claimed is:

1. A process of forming a nitride semiconductor device, comprising:
   epitaxially growing semiconductor layers made of nitride semiconductor materials on a substrate, the semiconductor layers forming a semiconductor stack;
   depositing a silicon nitride (SiN) film on the semiconductor stack by a low pressure chemical vapor deposition (LPCVD) technique at a deposition temperature;
   forming an opening in the SiN film;
   after the step of forming an opening, partially etching a surface of the semiconductor stack appearing within the opening in the SiN film to form a recess therein by using a plasma containing chlorine (Cl) ions, the etching roughening a peripheral area of a surface of the SiN film around the opening;
   after the step of partially etching, depositing metals within the recess of the semiconductor stack and on the peripheral area of the surface of the SiN film; and
   alloying the metals to form electrodes for a non-rectified contact against the semiconductor stack at an alloying temperature lower than the deposition temperature of the SiN film.

2. The process according to claim 1,
   wherein the step of depositing the SiN film forms the SiN film with a thickness of 10 to 100 nm.

3. The process according to claim 1,
   wherein the step of partially etching sets the peripheral area with a width of 0.4 to 0.7 μm from the opening in the SiN film.

4. The process according to claim 1,
   wherein the step of depositing metals includes a step of sequentially depositing a first metal layer and a second metal layer, the first metal layer being made of one of tantalum (Ta), titanium (Ti), and nickel (Ni), the second metal layer being made of aluminum (Al), and
   wherein the step of alloying the metals is carried out at the temperature of 500 to 600° C.

5. The process according to claim 1,
   wherein the semiconductor stack includes, from a side of the substrate, a channel layer made of gallium nitride (GaN), a barrier layer provided on the GaN channel layer, and a cap layer made of GaN provided on the barrier layer, the barrier layer being made of one of aluminum gallium nitride (AlGaN) and indium aluminum nitride (InAlN), and wherein the step of partially etching forms the recess by etching the cap layer and a portion of the barrier layer.

6. The process according to claim 1,
wherein the step of partially etching uses plasma generated by one of chlorine (Cl2) and silicon tetra-chloride (SiCl4).

7. The process according to claim 1,
wherein the step of depositing the SiN film is carried out under the deposition temperature of 700 to 800° C. and a deposition pressure of 10 to 60 Pa, using source gases of di-chloro-silane (SiH2Cl2) and ammonia (NH3) for silicon (Si) and nitrogen (N).

8. The process according to claim 1,
wherein the step of [exposing the surface of the semiconductor stack and the peripheral area of the surface of the SiN film] partially etching includes steps of:
coating the surface of the SiN film with a photoresist having a lower photoresist and an upper photoresist, the lower photoresist having optical sensitivity greater than optical sensitivity of the upper photoresist,
illuminating the upper photoresist and the lower photoresist concurrently, and
developing the upper photoresist and the lower photoresist,
wherein the upper photoresist provides an opening having a width greater than a width of the opening in the SiN film to fully expose the opening in the SiN film, the lower photoresist providing an opening with a width greater than the width of the opening in the upper photoresist, the upper photoresist forming an overhang with respect to the lower photoresist.

* * * * *